United States Patent
Abugharbieh et al.

(10) Patent No.: US 9,003,221 B1
(45) Date of Patent: Apr. 7, 2015

(54) SKEW COMPENSATION FOR A STACKED DIE

(75) Inventors: Khaldoon S. Abugharbieh, Happy Valley, OR (US); Daniel J. Ferris, III, Lakeville, MN (US); Loren Jones, Aromas, CA (US); Austin H. Lesea, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 404 days.

(21) Appl. No.: 13/438,814

(22) Filed: Apr. 3, 2012

(51) Int. Cl.
*G06F 11/00* (2006.01)
*G06F 11/32* (2006.01)

(52) U.S. Cl.
CPC .................................. *G06F 11/323* (2013.01)

(58) Field of Classification Search
USPC .............. 713/400, 401, 503; 365/63
See application file for complete search history.

(56) References Cited

U.S. PATENT DOCUMENTS

| | | | |
|---|---|---|---|
| 6,667,895 B2 * | 12/2003 | Jang et al. | 365/63 |
| 7,788,552 B2 * | 8/2010 | Gholami et al. | 714/715 |
| 2010/0027407 A1 * | 2/2010 | Liu | 370/201 |

* cited by examiner

*Primary Examiner* — Thuan Du
(74) *Attorney, Agent, or Firm* — W. Eric Webostad

(57) ABSTRACT

An embodiment for skew compensation for a stacked die is disclosed. For an embodiment of an apparatus, an interposer has a first and a second integrated circuit die coupled to the interposer. The first integrated circuit die includes an information generator, a signal delay compensator, and an input/output block. The information generator is configured to determine: a first delay value for a first path of the interposer between the first integrated circuit die and the second integrated circuit die; a second delay value for a second path of the interposer between the first integrated circuit die and the second integrated circuit die; and a difference between the first delay value and the second delay value. The signal delay compensator is coupled to receive the difference and configured to adjust a parameter of the first integrated circuit die to reduce the difference.

20 Claims, 16 Drawing Sheets

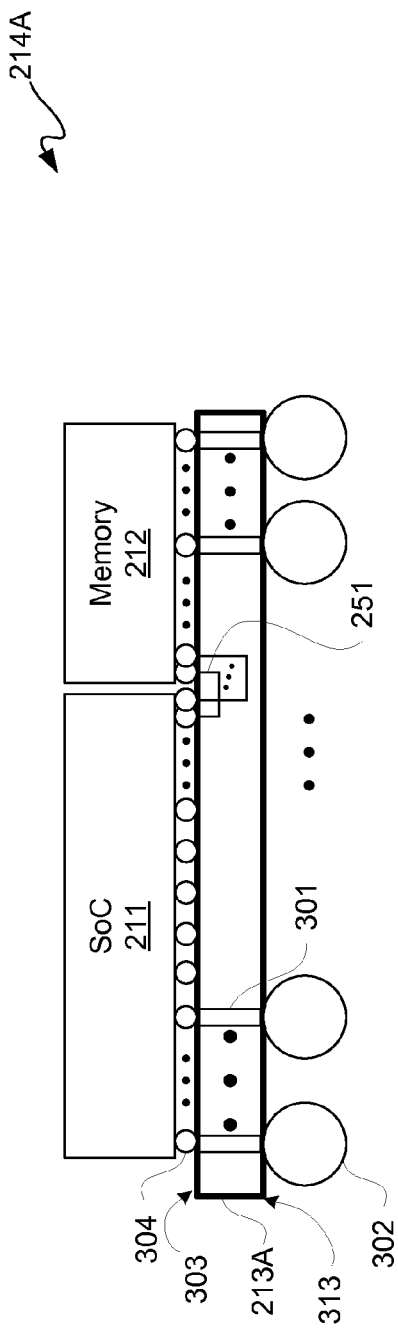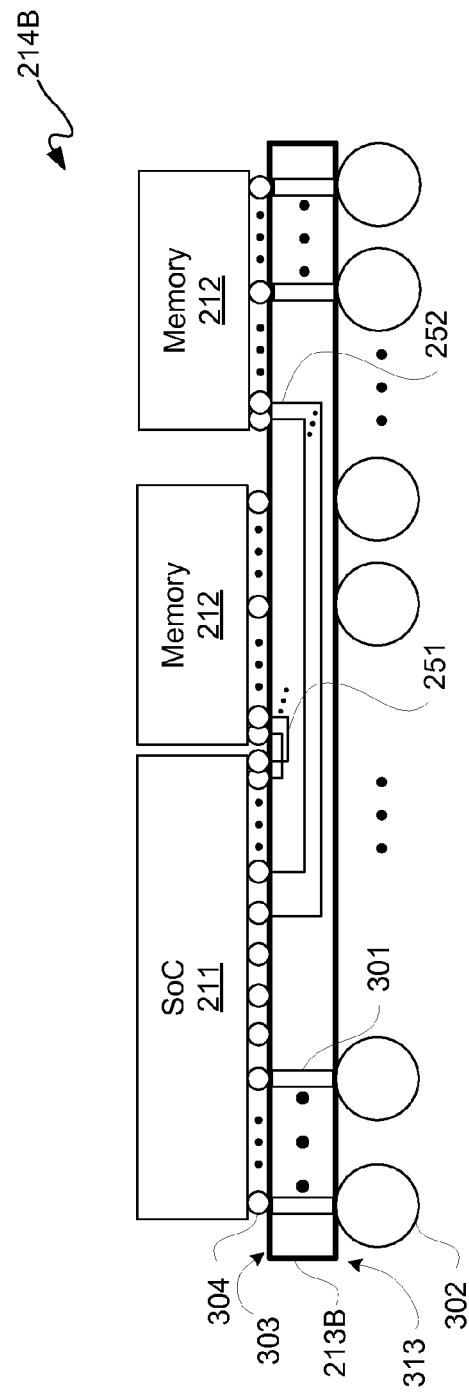

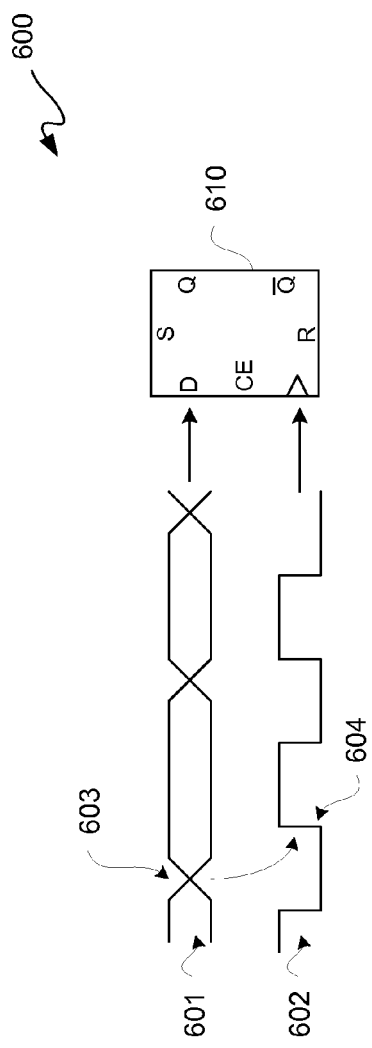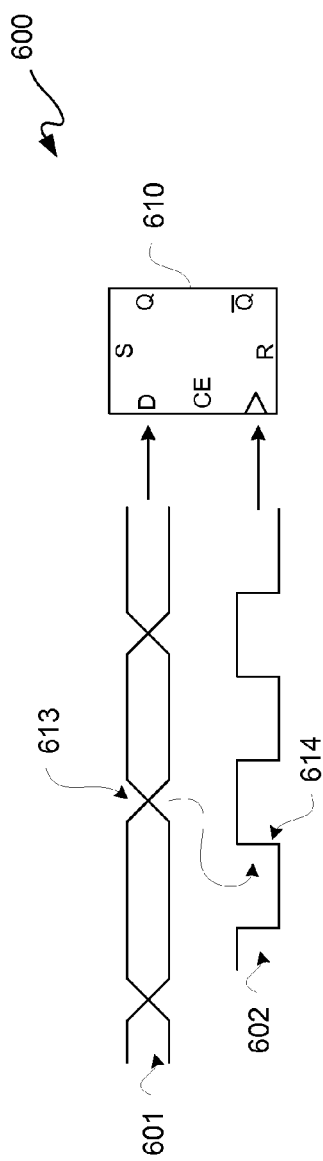

US 9,003,221 B1

SKEW COMPENSATION FOR A STACKED DIE

FIELD OF THE INVENTION

An embodiment relates to integrated circuit devices ("ICs"). More particularly, an embodiment relates to skew compensation for a stacked die IC.

BACKGROUND

Stacked die ICs may be formed from different interposer dies ("interposers"). These interposers may have different sizes and accommodate different types and/or numbers of integrated circuit dies. Such variation among interposers may include a variety of different path lengths for die-to-die interconnects on such interposers. This means that skew, namely propagation delay differences, on such paths may vary from interposer-to-interposer. However, customizing integrated circuit dies to interposers would be exceptionally costly.

Accordingly, it would be desirable and useful to provide integrated circuit dies that may be used on any of a variety of different interposers with different skews.

SUMMARY

One or more embodiments generally relate skew compensation for a stacked die IC.

An embodiment relates generally to an apparatus. In such an embodiment, an interposer has a first integrated circuit die and a second integrated circuit die coupled to the interposer. The first integrated circuit die includes an information generator, a signal delay compensator, and an input/output block. The information generator is configured to: determine a first delay value for a first path of the interposer between the first integrated circuit die and the second integrated circuit die; determine a second delay value for a second path of the interposer between the first integrated circuit die and the second integrated circuit die; and determine a difference between the first delay value and the second delay value. The signal delay compensator is coupled to receive the difference and configured to adjust a parameter of the first integrated circuit die to reduce the difference.

An embodiment relates generally to a method. In such an embodiment, a counter of a first integrated circuit die is activated at a first one of a plurality of first times. The counter is set to count to a threshold number. A first of a plurality of first pulses is sent by and from the first integrated circuit die to a second integrated circuit die via an interposer. At a first one of a plurality of second times, a first one of a plurality of second pulses is returned from the second integrated circuit die to the first integrated circuit die via the interposer. At a second one of the plurality of first times, a second one of the plurality of first pulses is sent. At a second one of the plurality of second times, a second one of the plurality of second pulses is returned from the second integrated circuit. A difference is determined. The difference is an elapsed time either between (a) the first one of the plurality of first times and a last one of the plurality of second times divided by the threshold number, or (b) a sum of each of the plurality of first times minus a corresponding one of the plurality of second times divided by the threshold number. The difference is converted for adjustment of a parameter of the first integrated circuit die. The parameter of the first integrated circuit die is adjusted responsive to the difference.

An embodiment relates generally to another method. In such an embodiment, a particular one of a first plurality of integrated circuit dies and a particular one of a second plurality of integrated circuit dies is coupled to a particular one of a plurality of interposers. A parameter of the particular one of the first plurality of integrated circuit dies is self-adjusted based on path delays of the particular one of the plurality of interposers that is selected.

BRIEF DESCRIPTION OF THE DRAWINGS

Accompanying drawings show exemplary embodiments. However, the accompanying drawings should not be taken to limit the embodiments shown, but are for explanation and understanding only.

FIG. 3 is a block diagram of a cross-sectional side view depicting an exemplary embodiment of a stacked die of the stacked dies of FIG. 2.

FIG. 4 is a block diagram of a cross-sectional side view depicting another exemplary embodiment of a stacked die of the stacked dies of FIG. 2.

FIGS. 6A and 6B are respective signal diagrams depicting data and clock signals.

DETAILED DESCRIPTION

Figure 1:
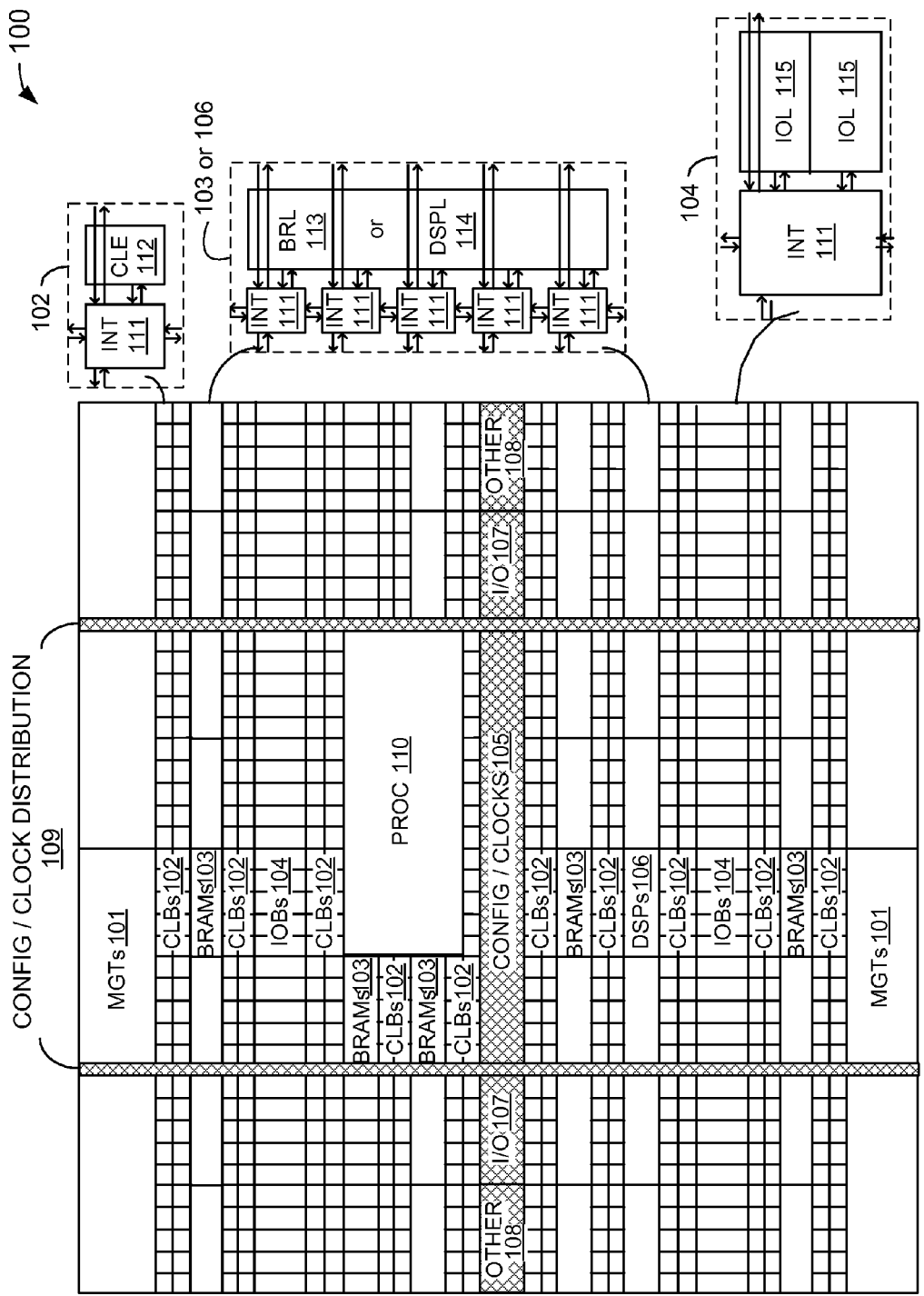
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure the one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

A stacked die assembler may have bins of one type of a first integrated circuit die and one type of a second integrated circuit die. These two types of integrated circuit dies may be attached to an interposer die ("interposer"), where die-to-die interconnects between the two types of integrated circuit dies are provided via an interposer. However, to provide different combinations of such first and second types of integrated circuit dies, different types of interposers with different die-to-die path delays, and thus different skews, may be used.

With the above general understanding borne in mind, various embodiments for a skew compensating integrated circuit die are generally described below. Such skew compensating integrated circuit die may self-adjust to an interposer to which they are coupled. By having skew compensating integrated circuit dies, such dies may be used with a variety of different interposers. For example, a same memory die and a same SoC die may be used on two different interposers, even though die-to-die interconnects via such interposers may have substantially different propagation delays, namely substantially different skews.

Because one or more of the above-described embodiments are exemplified using a particular type of IC, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
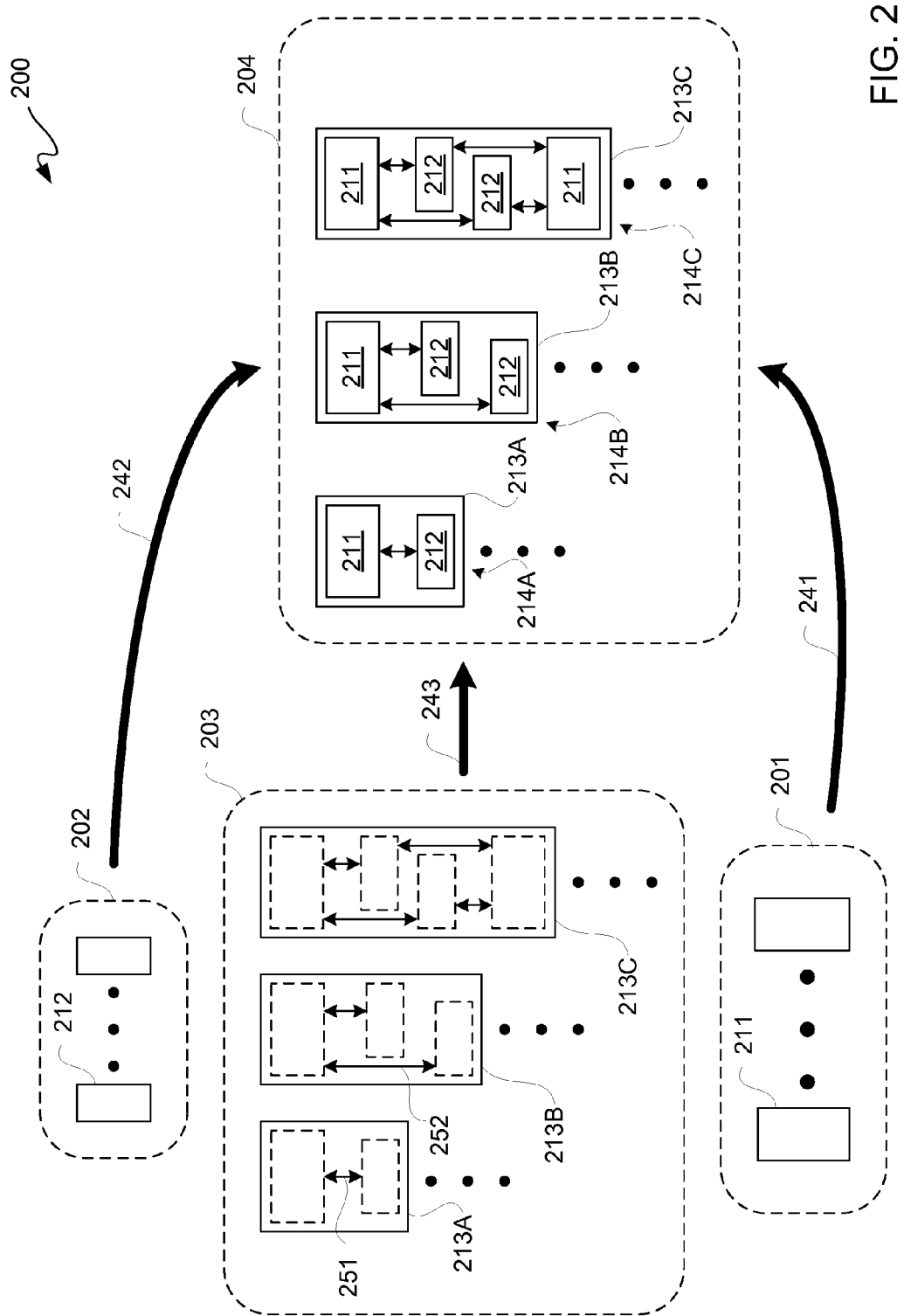
FIG. 2 is a flow diagram depicting an exemplary embodiment of a process for assembling stacked dies from different interposers.

FIG. 2 is a flow diagram depicting an exemplary embodiment of a process 200 for assembling stacked dies 214 from different interposers 213. In this exemplary embodiment, there is a bin 201 of a first type of integrated circuit dies 211 and a bin 202 of a second type of integrated circuit dies 212. For purposes of clarity by way of example not limitation, only two types of integrated circuit dies 211 and 212 are illustratively depicted. However, in other embodiments fewer or more than two types of integrated circuit dies may be used. Furthermore, in this exemplary embodiment, there is a bin 203 of different types of interposer dies ("interposers") 213. In this exemplary embodiment, pluralities of three types of interposers 213A, 213B, and 213C are illustratively depicted; however, in other embodiments two or more than three types of interposers 213 may be used.

Interposers 213A, 213B, and 213C have different configurations with different path delays. For example, interposer 213A is configured for one integrated circuit die 211 coupled to another integrated circuit die 212 via such interposer. However, interposer 213B is configured for one integrated circuit die 211 coupled to two integrated circuit dies 212 via such interposer. Lastly, interposer 213C is configured for two integrated circuit dies 211 coupled to two integrated circuit dies 212 via such interposer.

Each interposer 213 is configured to have attached to it at least one integrated circuit die 211 from bin 201 and at least one other integrated circuit die 212 from bin 202. However, path delay between such integrated circuit die 211 and integrated circuit die 212 may be substantially different depending on which interposer 213 is selected from bin 203. For example, path delay of paths 251 may be substantially shorter than path delay of paths 252 of interposer 213B and/or 213C. Furthermore, there may be different path delays among conductive paths 251, for example.

When an integrated circuit die 211 is obtained from bin 201 it may be used on any of interposers 213A, 213B, or 213C of bin 203. However, the amount of path or propagation delay may vary significantly among interposers 213. As described below in additional detail, integrated circuit dies may be a self-adjusting or pseudo-self-adjusting ("self-adjusting") to account for such different path delays, namely to adapt to a selected interposer 213 to which such integrated circuit die is attached.

Pluralities of stacked dies 214 of bin 204 may be assembled by obtaining dies from bins 201, 202, and 203, as generally indicated by arrows 241 through 243, respectively, to provide pluralities of stacked dies 214A, 214B, and 214C respectively associated with interposers 213A, 213B, and 213C. For example, stacked die 214A may be assembled to include an integrated circuit die 211 and an integrated circuit die 212 coupled to interposer 213A for die-to-die communication via interposer 213A, namely intra-stacked die communication. Likewise, stacked die 214B may be assembled to include an integrated circuit die 211 and two integrated circuit dies 212 coupled to interposer 213B for die-to-die communication via interposer 213B, namely intra-stacked die communication. Lastly, stacked die 214C may be assembled to include two integrated circuit dies 211 and two integrated circuit dies 212 coupled to interposer 213C for intra-stacked die communication.

By having a die capable of self-adjustment to different path delays, different configurations of assembled stacked dies 214 may be manufactured using different configurations of interposers 213 without having to have integrated circuit dies 211 and 212 customized to particular interposers 213. Integrated circuit dies 211 and 212 may be any type of integrated circuit dies. However, for purposes of clarity by way of example and not limitation, it shall be assumed integrated circuit dies 211 may be any of a variety of system-on-chip ("SoC") dies, including without limitation FPGA dies, ASSP dies, ASIC dies, chipset dies, or microprocessor dies, and integrated circuit dies 212 may be any of a variety of types of memory dies, including without limitation DRAM, SRAM, EEPROM, NAND flash, or NOR flash. Accordingly, any integrated circuit die 211 of bin 201 may be used with any of interposers 213A through 213C, and likewise any memory die 212 of bin 202 may be used with any of interposers 213A through 213C. For purposes of clarity by way of example and not limitation, it shall be assumed that integrated circuit die 211 is an SoC die, and integrated circuit die 212 is a memory die.

FIG. 3 is a block diagram of a cross-sectional side view depicting an exemplary embodiment of a stacked die 214A. Stacked die 214A includes SoC die 211, memory die 212, fine pitch micro balls or bumps ("bumps") 304, interposer 213A, and $C_4$ balls or bumps ("balls") 302. Interposer 213A may include through substrate vias 301 and conductive paths 251. Conductive paths 251 may be formed of one or more via layers and/or one or more metal layers in the formation of interposer 213A. For a silicon substrate embodiment of an interposer 213A, through substrate vias 301 may be through silicon vias ("TSVs").

Through substrate vias 301 may couple bumps 304 disposed on an upper surface 303 of interposer 213A to balls 302 attached to a lower surface 313 of interposer 213A. Conductive paths 251 may be used to couple SoC die 211 and memory die 212 for communication between such two dies. Bumps 304 may be used to couple paths 251 to SoC die 211 and to memory die 212.

FIG. 4 is a block diagram of a cross-sectional side view depicting an exemplary embodiment of a stacked die 214B. Stacked die 214B includes SoC die 211, two memory dies 212, bumps 304, interposer 213B, and balls 302. Interposer 213B may include through substrate vias 301 and conductive paths 251 and 252. Conductive paths 251 and 252 may be formed of one or more via layers and/or one or more metal layers in the formation of interposer 213B. For a silicon substrate embodiment of an interposer 213B, through substrate vias 301 may be TSVs.

Through substrate vias 301 may couple bumps 304 disposed on an upper surface 303 of interposer 213B to balls 302 attached to a lower surface 313 of interposer 213B. Conductive paths 251 and 252 may be used to couple SoC die 211 and each of memory dies 212 for communication between pairs of such dies. Bumps 304 may be used to couple paths 251 and 252 to SoC die 211 and to memory dies 212.

Paths 251 are shorter than paths 252. Moreover, in some embodiments, not all of paths 251 may be the same length, and/or not all of paths 252 may be the same length. Accordingly, it should be understood that different propagation delays or path delays may exist within or among different stacked die due to different configurations of interposers.

Figure 5A:
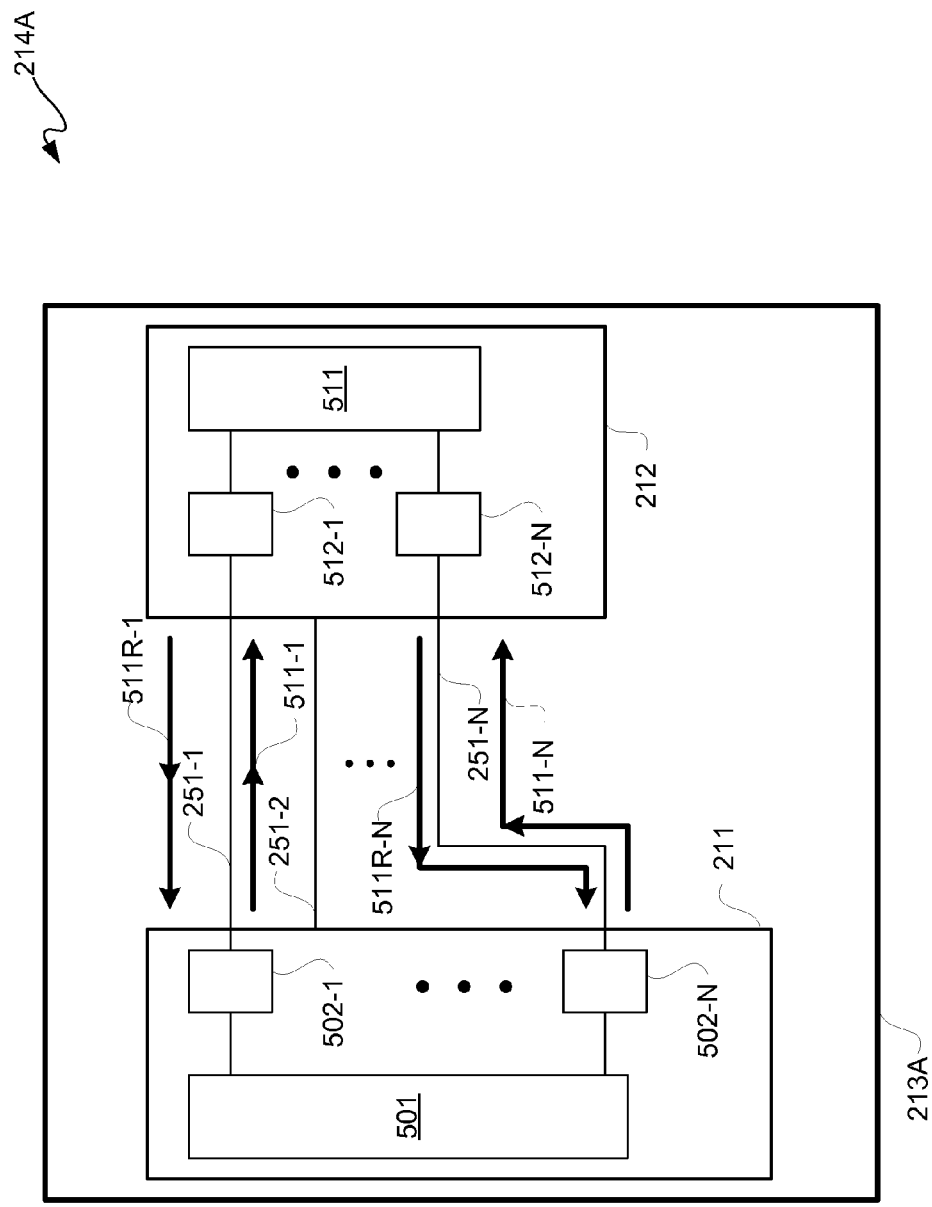
FIG. 5A is a block diagram of a top view depicting an exemplary embodiment of the stacked die of FIG. 3.

FIG. 5A is a block diagram of a top view depicting an exemplary embodiment of stacked die 214A. Even though the example of stacked die 214A is used, the following description applies to any stacked die assembly.

SoC die 211 may include I/O blocks 502-1 through 502-N coupled to other SoC circuitry 501, and memory die 212 may include I/O blocks 512-1 through 512-N coupled to other memory circuitry 511 for N a positive integer greater than one. Paths 251-1 through 251-N of interposer 213A may be respectively coupled to I/O blocks 502-1 through 502-N and to I/O blocks 512-1 through 512-N. In this exemplary embodiment, SoC die 211 may transmit signals 511-1 through 511-N respectively from I/O blocks 502-1 through 502-N onto paths 251-1 through 251-N for reception by I/O blocks 512-1 through 512-N. Transmitted signals 511-1 through 511-N may be respective pulse trains. I/O blocks 512-1 through 512-N may be configured to receive and retransmit such signals 511R-1 through 511R-N onto paths 251-1 through 251-N for reception by I/O blocks 502-1 through 502-N.

The sending and receiving of pulses may be used to determine path delay of each of paths 251, as described below in additional detail. I/O blocks 502 may be configured to be self-adjusting to compensate for different path delays among paths 251. In this exemplary embodiment, single-ended signaling is described, where pulse trains are sent and resent using generally a same conductive path of interposer 213A. However, in another embodiment, a train of pulses may be sent from SoC die 211 to memory die 212 using a path of interposer 213A, and such train of pulses may be resent from memory die 212 to SoC die 211 via another path, different from the one used to send such train of pulses.

Figure 5B:
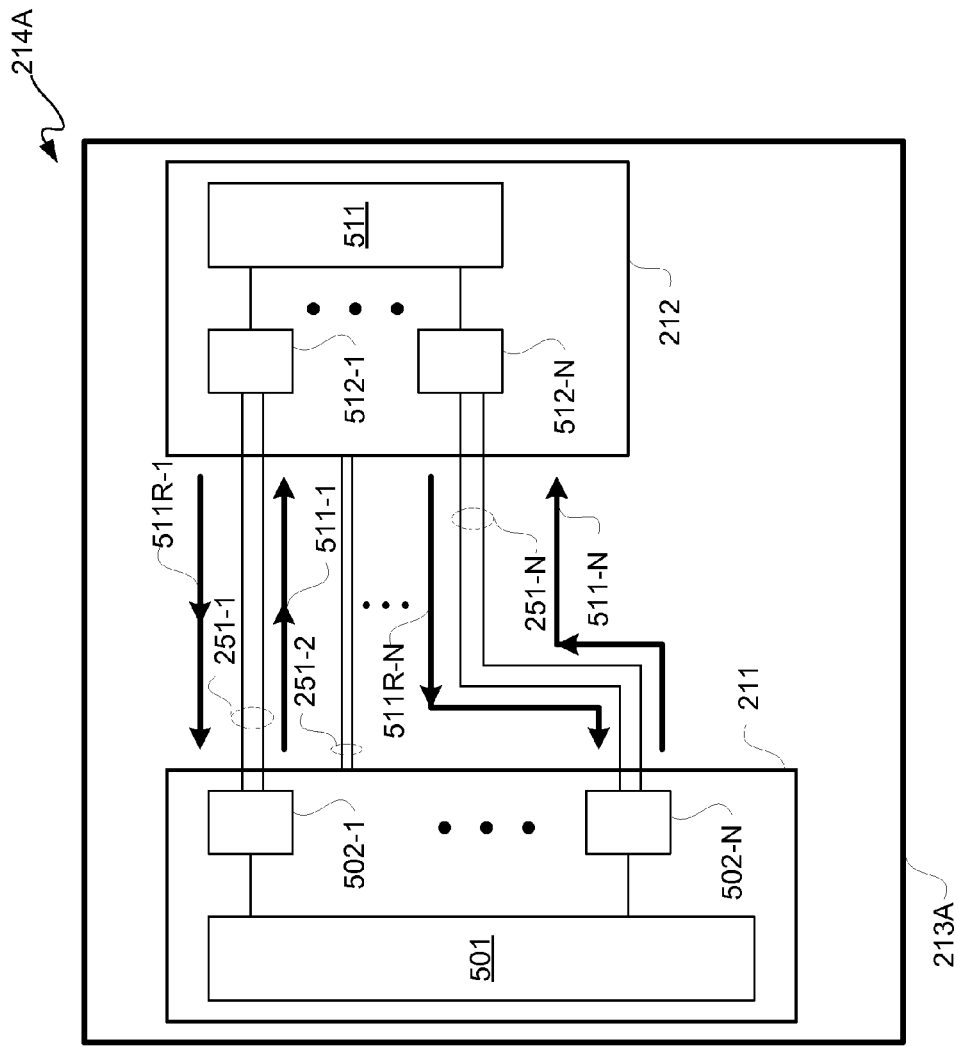
FIG. 5B is a block diagram of a top view depicting another exemplary embodiment of the stacked die of FIG. 3.

FIG. 5B is a block diagram of a top view depicting another exemplary embodiment of stacked die 214A. Stacked die 214A of FIG. 5B is generally the same as stacked die 214A of FIG. 5A, except that differential signaling is illustratively depicted.

As illustratively depicted in FIGS. 5A and 5B, some interposer paths 251 may have longer path lengths than other interposer paths 251. Accordingly, longer path lengths will have longer signal propagation delays then shorter path lengths of an interposer. Other things that may contribute to different signal propagation delays include without limitation different micro bumps pitches, and/or differences in rows and/or columns within a micro bump array. Different signal propagation delays or skew may have adverse effects on a timing budget of a system.

FIGS. 6A and 6B are respective signal diagrams depicting a data signal 601 and a clock signal 602. Data signal 601 may be fed to a data port of a register 610, such as a delay-type flip-flop, and clock signal 602 may be fed to a clock port of such registers 610.

With reference to FIG. 6A, data propagated along a long interposer wire is illustratively depicted for data signal 601. Data crossing 603 of data signal 601 lags behind a rising edge 604 of clock signal 602, which is to indicate that such data arrives late. Late arriving data marginalizes set up time, namely reduces the amount of margin for set up time, for register 610.

With reference to FIG. 6B, data propagated along a short interposer wire is illustratively depicted for data signal 601. Data crossing 613 of data signal 601 leads a rising edge 614 of clock signal 602, which is to indicate that such data arrives early. Early arriving data marginalizes hold time, namely reduces the amount of margin for hold time, for register 610.

Accordingly, reducing skew due to varying interposer signal line lengths may enhance set-up and/or hold times of a system. Furthermore, process-voltage-temperature ("PVT") variations may increase the variability of such skew, and thus an ability to adjust such variation after fabrication and/or during operation may be useful in reducing skew.

Figure 7:
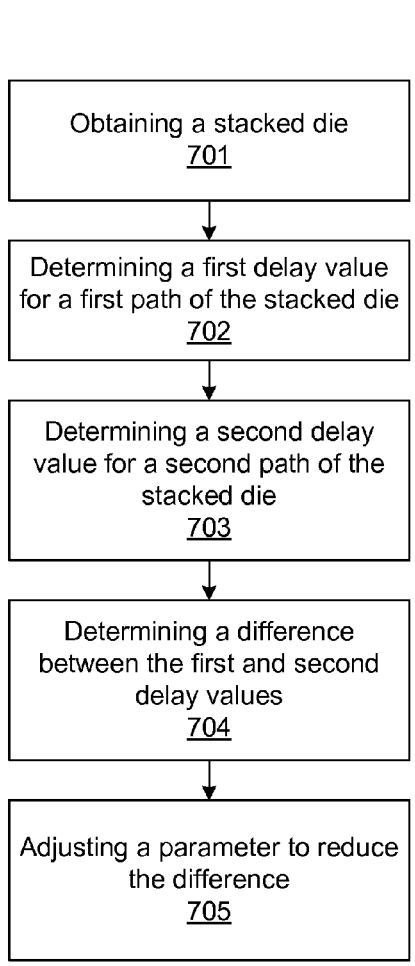
FIG. 7 is a flow diagram depicting an exemplary embodiment of a parameter adjustment process.

FIG. 7 is a flow diagram depicting an exemplary embodiment of a parameter adjustment process 700. For purposes of clarity by way of example and not limitation, parameter adjustment process 700 is further described with simultaneous reference to FIGS. 5A and 7. At 701, a stacked die, such as for example a stacked die 214A of FIG. 2, is obtained. At 702, a delay value for a first path 251-1 of such stacked die 214A is determined. Such delay value may be a round-trip delay of signal 511R-1.

At 703, a delay value for a second path 251-2 of such stacked die 214A is determined. Such delay value may be a round-trip delay of signal 511R-2. A delay value for each of paths 251-N for stacked die 214A may be determined. Along those lines, delay values for a signal bus or interface may be determined for an SoC die 211 for communication with a memory die 212. Even though determining only two delays is described for purposes of clarity, it should be understood that more than two delays may be determined as there may be more than two signal lines of a bus.

At 704, a difference between the delays determined at 702 and 703 is determined. At 705, a parameter of SoC die 211 is adjusted to reduce such difference. There may be some maximum and minimum values to which a parameter may be adjusted. Correspondingly, there may be maximum and minimum amounts of delay added, or subtracted, for providing a signal onto a signal line to reduce skew. For predetermined system set-up and hold times, delay values may be either increased or decreased, or left unchanged, in order to be within predetermined system timing.

Figure 8:
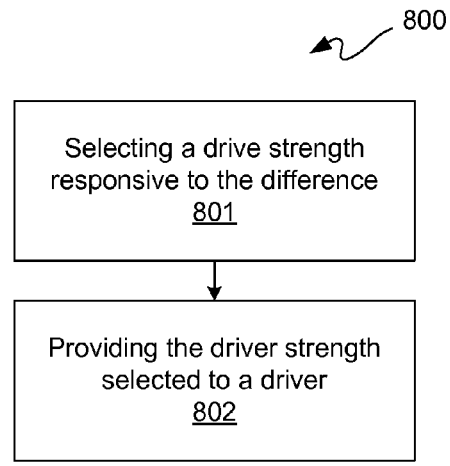
FIG. 8 is a flow diagram depicting an exemplary embodiment of a drive strength selection process for the parameter adjustment process of FIG. 7.

FIG. 8 is a flow diagram depicting an exemplary embodiment of a drive strength selection sub-routine 800 for parameter adjustment process 700 of FIG. 7. Sub-routine 800 may be for operation 705. At 801, a drive strength is selected responsive to a difference determined at 704. Such drive strength may be the parameter adjusted at 705. At 802, such drive strength selected at 801 is provided to a driver at 802. Such driver may be of SoC die 211, and such driver may be used for driving a signal 511-N onto a signal line 251-N.

Figure 9A:
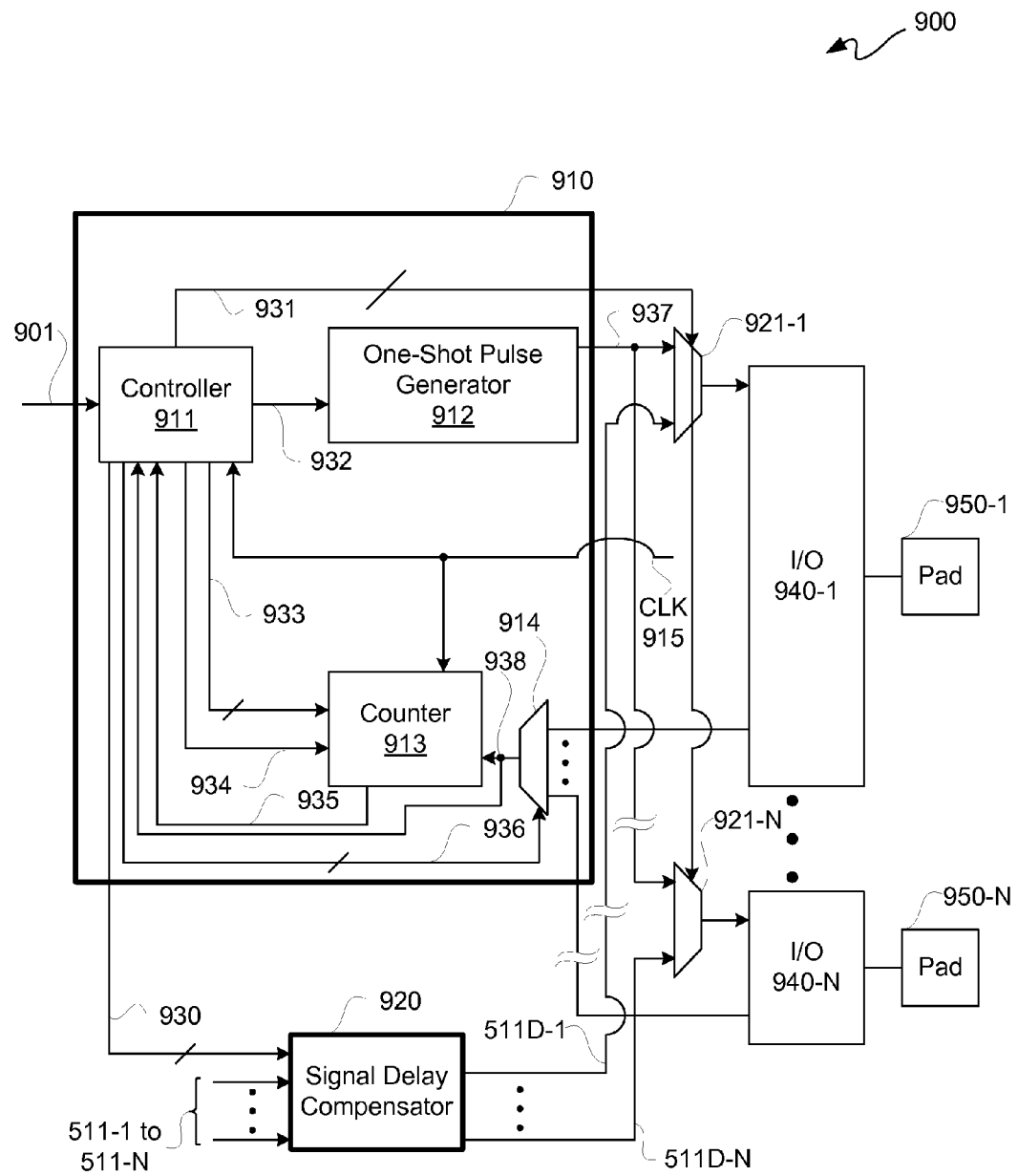
FIG. 9A is a block/circuit diagram depicting an exemplary embodiment of a delay compensation circuit of an integrated circuit die of a stacked die of the stacked dies of FIG. 2.
Figure 14:
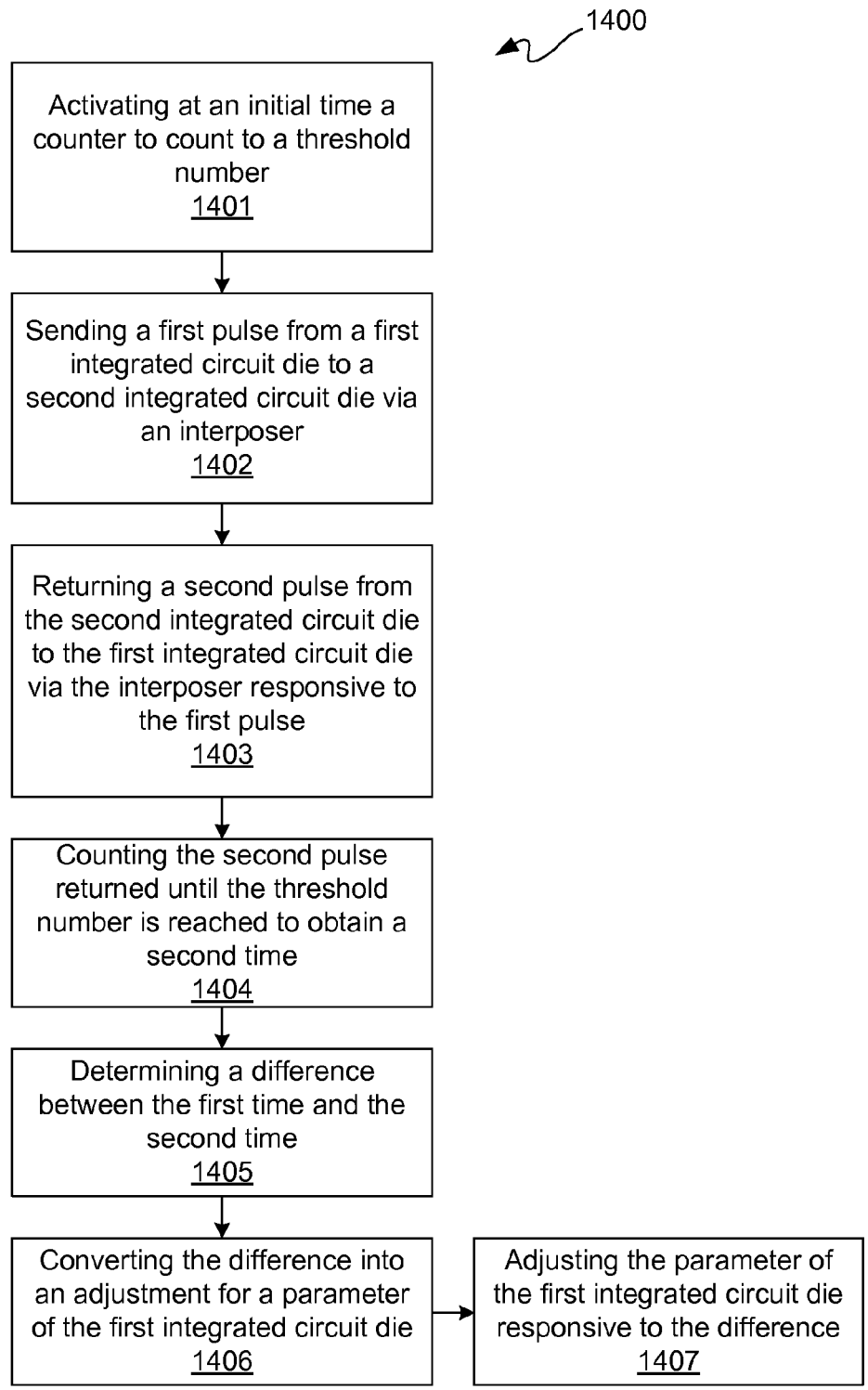
FIG. 14 is a flow diagram depicting an exemplary embodiment of a delay determination flow.

FIG. 9A is a block/circuit diagram depicting an exemplary embodiment of a delay compensation circuit 900 of an integrated circuit die of a stacked die. For example, delay compensation circuit 900 may be in SoC die 211 of stacked die 214A of FIG. 2. FIG. 14 is a flow diagram depicting an exemplary embodiment of a delay determination flow 1400. With simultaneous reference to FIGS. 5A, 5B, 9A, and 14, delay compensation circuit 900 and delay determination flow 1400 are further described.

Delay compensation circuit 900 includes signal delay compensator 920 and delay compensation information generator ("information generator") 910. Signal delay compensator 920 may be a state machine configured in accordance with the description herein. Signal delay compensator 920 may be coupled to receive signals 511, and signals 511 may be compensated for skew by signal delay compensator 920 after signal delay compensator 920 has been conditioned to provide such compensation. Skew compensated signals 511-1 through 511-N may be provided as respected inputs to multiplexers 921-1 through 921-N. A control select signal 931 may be provided to multiplexers 921-1 through 921-N. Control select signal 931 may be sourced from controller 911 of information generator 910.

Outputs from multiplexers 921-1 through 921-N are respectively provided to I/O blocks 940-1 through 940-N. I/O blocks 940-1 through 940-N may have corresponding pads 950-1 through 950-N for an interposer interface or bus. Pads 950-1 through 950-N may correspond to signal lines 251-1 through 251-N.

Information generator 910 may include controller 911, multiplexer 914, one-shot pulse generator 912, and counter 913. A control signal 901 may be asserted to controller 911 to initiate a skew adjustment mode. At 1401, activation of counter 913 at an initial time of skew adjustment mode may be used to count to a threshold number of pulses. Controller 911 may be a state machine.

For a skew adjustment mode, controller 911 may assert control select signal 931 in order to select one of multiplexers 921-1 through 921-N to output test signal 937 obtained as an input from one-shot pulse generator 912. Controller 911 may assert control signal 932 to cause one-shot pulse generator 912 to output test signal 937. In this exemplary embodiment, test signal 937 output from one-shot pulse generator 912 is a single pulse, which may be asynchronously output responsive to assertion of control signal 932. In other embodiments, more than one pulse may be sent at a time. At 1402, such individual pulse as test signal 937 may be sent from SoC die 211 to a memory die 212 via interposer 213.

During a skew adjustment mode, one of the outputs of multiplexers 921-1 through 921-N may be active, namely may output test signal 937. For purposes of clarity by way of example and not limitation, it shall be assumed that delay associated with a signal line 251-1 coupled to pad 950-1 is being tested. Controller 911 may assert control select signal 936 provided to multiplexer 914 to select an input obtained from an I/O block 940-1 through 940-N, which for the example may be I/O block 940-1 for output to counter 913.

A clock signal 915 may be provided to counter 913, as well as controller 911. One-shot pulse generator 912 may provide another pulse as test signal 937 after a prior pulse 938 has been received, and such received pulse 938 may be provided to controller 911 for assertion of control signal 932 to cause one-shot pulse generator 912 to assert another pulse as test signal 937 provided, however, that count done signal 935 is not asserted by counter 913 in response to receiving such returned pulse 938. Each pulse of test signal 937 may be asynchronously or individually sent generally responsive to a path delay.

Test signal 937 may be provided via I/O block 940-1 and pad 950-1 to signal line 251-1, and each pulse of such test signal 937 or in response to such test signal 937 may be provided back to counter 913 via signal line 251-1, pad 950-1, I/O block 940-1, and multiplexer 914 as a returned pulse 938. Output of multiplexer 914 may be a returned pulse 938 for input to counter 913 and to controller 911. At 1403, each pulse may be sent from memory die 212 to SoC die 211 via interposer 213 responsive to each pulse of test signal 937 sent from SoC die 211. It should be understood that delay may be characterized with a single round trip pulse; however, a more accurate value may be determined by using multiple instances of such single round trip pulse.

Controller 911 may provide a set count signal 933 to counter 913 to count to a threshold number, namely to count to a threshold number of pulses equal to or greater than one. At 1404, counter 913 may count each returning pulse until a threshold number is reached to obtain another point in time away from an initial time at which test signal 937 was initially asserted for determining delay of a signal path. Controller 911 may further provide a start signal 934 to counter 913 corresponding to initial assertion of control signal 932 for a process to determine delay of a path. After counter 913 reaches such a threshold number, namely reaches a value associated with such count signal 933, counter 913 may assert count done signal 935 for controller 911.

At 1405, a difference may be determined, where such difference is between an initial time and a completion time for counting pulses for a round-trip path generally on interposer 213. Controller 911, which may have a counter for counting pulses of clock signal 915, may be configured to determine a difference in time from starting counting by counter 913 to finishing counting by counter 913 responsive to reaching such threshold number for determining path delay of a path. For example, a difference in time may be an elapsed time between starting and finishing counting pulses for a path being test divided by a threshold number. Thus, such a difference in time may represent an average value for path delay of a path under test, and this average value may be provided as a determined delay or time difference for a path, namely provided as a difference signal. In another embodiment, a starting time may be sent for each pulse sent, and an associated finishing time may be captured for each associated pulse returned. Such starting and ending time pairs may represent multiple determined path delays for a path. Such determined path delays may be summed and divided by a total number of the pairs, such as a threshold number of pulses, to determine an average path delay for a path, and such average path delay may be provided as a difference signal. In this example, such difference in time indicates a delay associated with signal line 251-1. Controller 911 may provide such difference as difference signal 930 to signal delay compensator 920.

After determining a time difference associated with signal line 251-1, such adjustment mode may continue for determining a time difference associated with another signal line until all signal lines 251-1 through 251-N have time differences determined for each of them. Pulses used to determine path delays associated with signal lines 251-1 through 251-N may be logic one pulses, logic zero pulses, or a combination thereof.

Signal delay compensator 920 may have time differences for each of signal lines 951-1 through 951-N in order to adjust skew across signal lines of a bus or interface. At 1406, a difference, or each of such differences, may be converted into an adjustment for a parameter or parameters of SoC die 211, as described below in additional detail. At 1407, such parameter or parameters of SoC die 211 may be adjusted responsive to each difference determined at 1405.

Input signals 511 may thus be adjusted to provide skew adjusted input signals 511-1 through 511-N respectively for I/O blocks 940-1 through 940-N. A skew adjustment mode may be exited by de-asserting control select signal 931 such that skew adjusted input signals 511-1 through 511-N are output from multiplexers 921-1 through 921-N, respectively. In this embodiment of delay compensation circuit 900, input signals 511 are individually delayed, such as with respective delay lines as described below in additional detail, to provide skew adjusted input signals 511-1 through 511-N. Skew may be adjusted to obtain a minimum delay, a maximum delay, or some other delay. Skew may be adjusted to increase speed, to reduce power consumption, or some trade-off between these two factors.

Figure 9B:
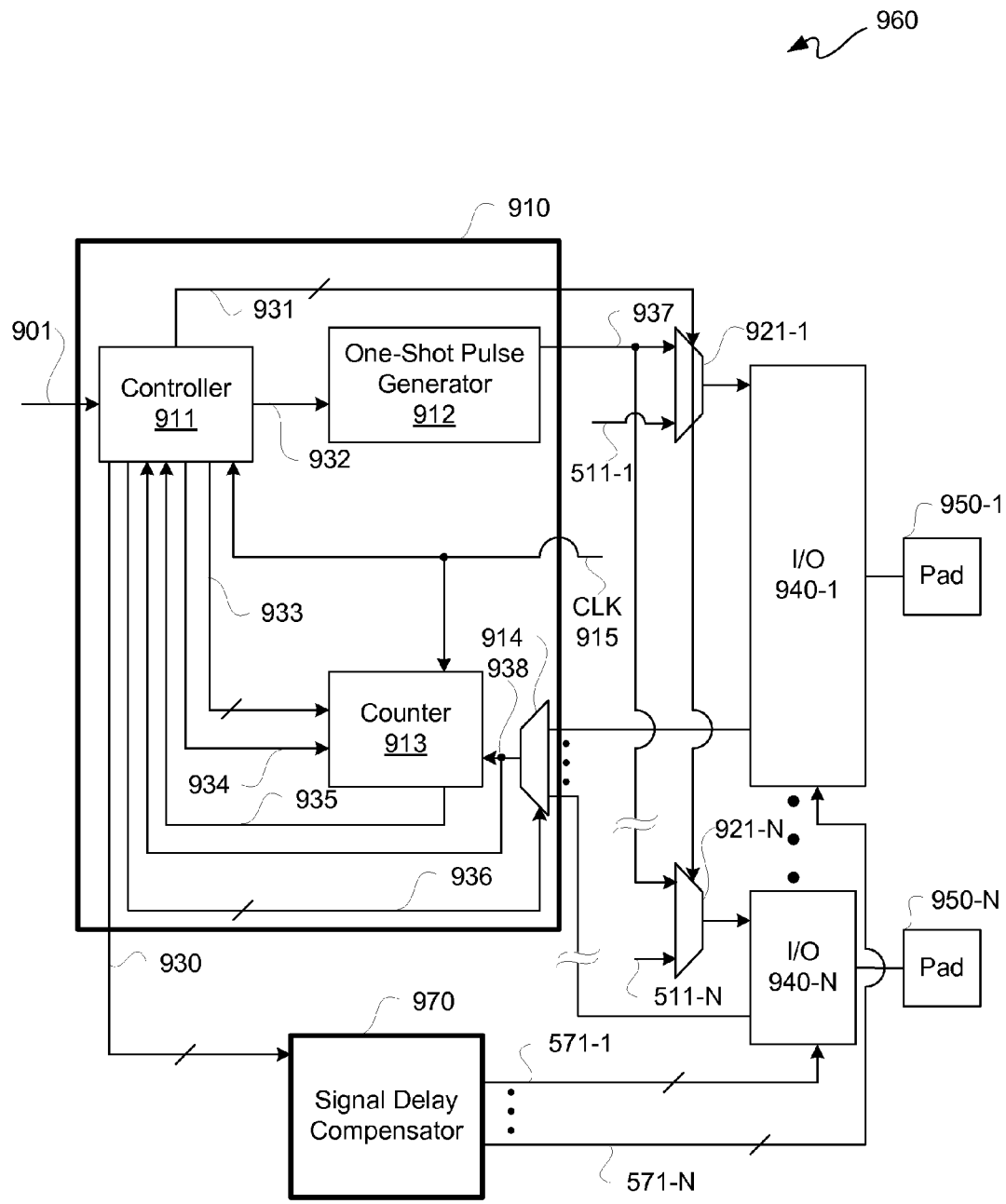
FIG. 9B is a block/circuit diagram depicting another exemplary embodiment of a delay compensation circuit of an integrated circuit die of a stacked die of the stacked dies of FIG. 2.

FIG. 9B is a block/circuit diagram depicting another exemplary embodiment of a delay compensation circuit 960 of an integrated circuit die of a stacked die. For example, delay compensation circuit 960 may be in SoC die 211 of stacked die 214A of FIG. 2. With simultaneous reference to FIGS. 5A, 5B, and 9B, delay compensation circuit 960 is further described. As much of delay compensation circuit 960 is the same as delay compensation circuit 900 of FIG. 9A, common description is not repeated for purposes of clarity.

In delay compensation circuit 960 of FIG. 9B, input signals 511-1 through 511-N, which have not as yet been skew adjusted, are provided as input to multiplexers 921-2 through 921-N, respectively. Difference signals 930 are provided for each path to a signal delay compensator 970 of FIG. 9B. Output voltages 571-1 through 571-N of signal delay compensator 970 responsive to difference signals 930 respectively associated with determined delays of signal lines 251-1 through 251-N, as previously described, are provided to I/O blocks 940-1 through 940-N, respectively. Output voltages 571-1 through 571-N may be parameters of SoC die 211, such as transistor gating voltages and/or transistor regulated source voltages, as described below in additional detail. Such individual or combination of transistor gating voltages and/or transistor regulated source voltages may be used to adjust drive strength of drivers of I/O blocks 940-1 through 940-N, as described below in additional detail. Output voltages 571-1 through 571-N may be gating voltages 571G-1 through 571G-N of FIG. 10B or supply voltages 571S-1 through 571S-N of FIG. 10C, or a combination of such gating and supply voltages.

Figure 10A:
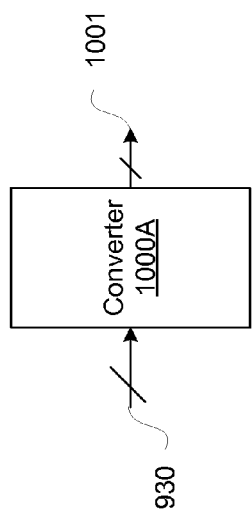
FIGS. 10A through 10C are block diagrams depicting respective exemplary embodiments of converters.
Figure 10B:
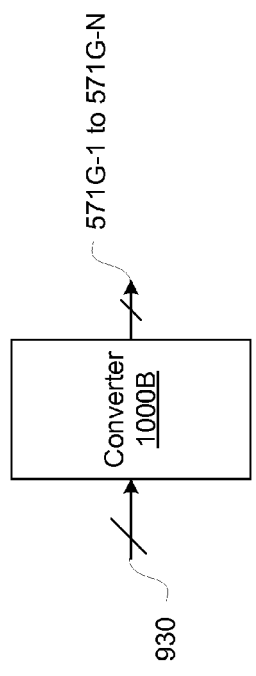
Figure 10C:
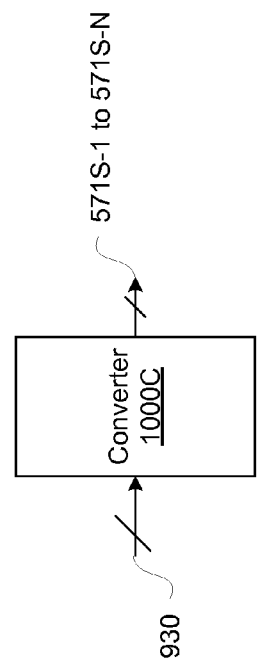

FIGS. 10A through 10C are block diagrams depicting respective exemplary embodiments of converters 1000. With reference to FIG. 10A, converter 1000A may be coupled to receive difference signal 930 to provide skew adjusted input signals 511-1 through 511-N respectively for I/O blocks 940-1 through 940-N as previously described with reference to FIG. 9A. Converter 1000A may be part of signal delay compensator 920 of FIG. 9A. Converter 1000A may include a lookup table, memory, and/or registers for converting each received difference signal 930 into an address or other control select signal 1001 for selecting taps of the delay line, as described below in additional detail, and/or for selecting legs of a driver, as described below in additional detail.

With reference to FIG. 10B, converter 1000B may be coupled to receive difference signal 930 to provide driver transistor gating voltages 571G-1 through 571G-N respectively for I/O blocks 940-1 through 940-N as previously described with reference to FIG. 9B. Converter 1000B may be part of signal delay compensator 970 of FIG. 9B. Converter 1000B may include a lookup table, memory, and/or registers for converting each received difference signal 930 into driver transistor gating voltages 571G-1 through 571G-N, as described below in additional detail. Along those lines, in an embodiment, converter 1000B may provide a PMOS gating voltage and/or an NMOS gating voltage.

With reference to FIG. 10C, converter 1000C may be coupled to receive difference signal 930 to provide driver transistor regulated supply voltages 571S-1 through 571S-N respectively for I/O blocks 940-1 through 940-N as previously described with reference to FIG. 9B. Converter 1000C may be part of signal delay compensator 970 of FIG. 9B. Converter 1000C may include a lookup table, memory, and/or registers for converting each received difference signal 930 into driver transistor regulated supply voltages 571S-1 through 571S-N, as described below in additional detail. Along those lines, in an embodiment, converter 1000C may provide a pull-up or high regulated supply voltage and/or a pull-down or low regulated supply voltage.

Figure 11:
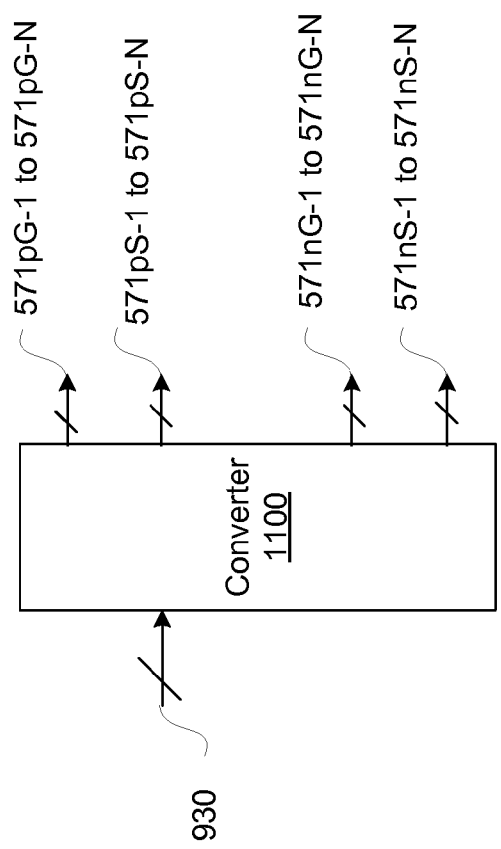
FIG. 11 is a block diagram depicting another exemplary embodiment of a converter.

FIG. 11 is a block diagram depicting another exemplary embodiment of a converter 1100. Converter 1100 may be coupled to receive difference signal 930 to provide: driver PMOS transistor gating voltages 571pG-1 through 571pG-N respectively for I/O blocks 940-1 through 940-N as previously described with reference to FIG. 9B; driver PMOS transistor regulated supply voltages 571pS-1 through 571pS-N respectively for I/O blocks 940-1 through 940-N as previously described with reference to FIG. 9B; driver NMOS transistor gating voltages 571nG-1 through 571nG-N respectively for I/O blocks 940-1 through 940-N as previously described with reference to FIG. 9B; and driver NMOS transistor regulated supply voltages 571nS-1 through 571nS-N respectively for I/O blocks 940-1 through 940-N as previously described with reference to FIG. 9B. Converter 1100 may be part of signal delay compensator 970 of FIG. 9B. Converter 1100 may include a lookup table, memory, and/or registers for converting each received difference signal 930 into driver transistor regulated supply voltages and gating voltages, as described below in additional detail.

Figure 12A:
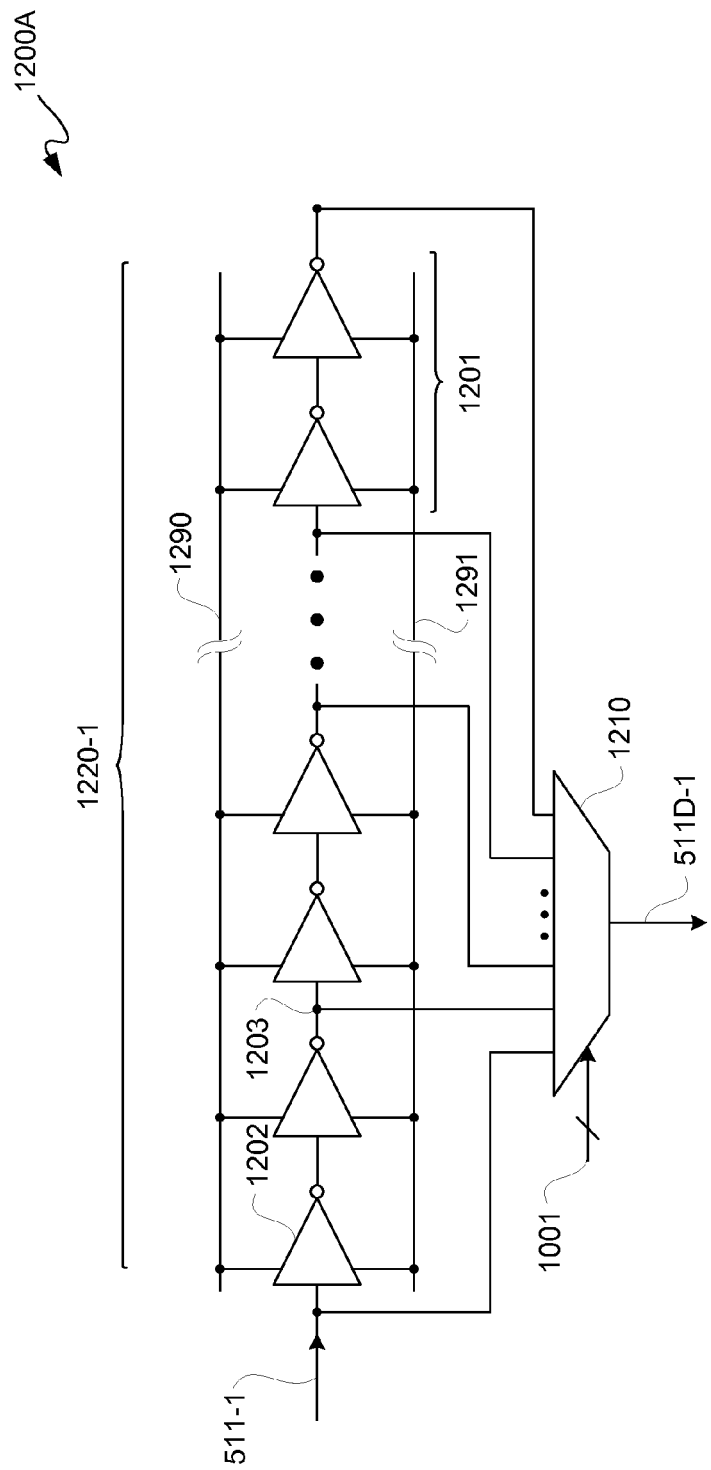
FIGS. 12A and 12B are circuit diagrams depicting respective exemplary embodiments of delay compensation circuits.

FIG. 12A is a circuit diagram depicting an exemplary embodiment of a delay compensation circuit 1200A. Delay compensation circuit 1200A includes a delay chain 1220-1 and multiplexer 1210. In this exemplary embodiment, a delay chain 1220-1 is formed of a series of delay elements 1201. In this exemplary embodiment, delay elements 1201 are pairs of inverters 1202 coupled in series, where each inverter 1202 is coupled between VDD 1290 and ground 1291. Between each pair of inverters 1202 are taps 1203. Each of taps 1203 is coupled to an input of multiplexer 1210. However, it should be appreciated that any of a variety of delay circuits, including without limitation buffers, may be used in sets of one or more.

Delay chain 1220-1 is coupled to receive input signal 511-1. It should be understood that any of input signals 511-1 through 511-N may be input to a respective delay chain 1220; however, only a single delay chain 1220-1 is illustratively depicted for purposes of clarity and not limitation. Multiplexer 1210, which is coupled to receive control select signal 1001 to select an input tap 1203 to be used as an output, provides as an output a skew adjusted input signal 511D-1.

As input signal 511-1 propagates down delay chain 1220-1, a tap 1203 may be selected responsive to control select signal 1001 to adjust a parameter of SoC die 211, namely either to add delay or to generally leave input signal 511-1 the same with respect to delay.

Figure 12B:
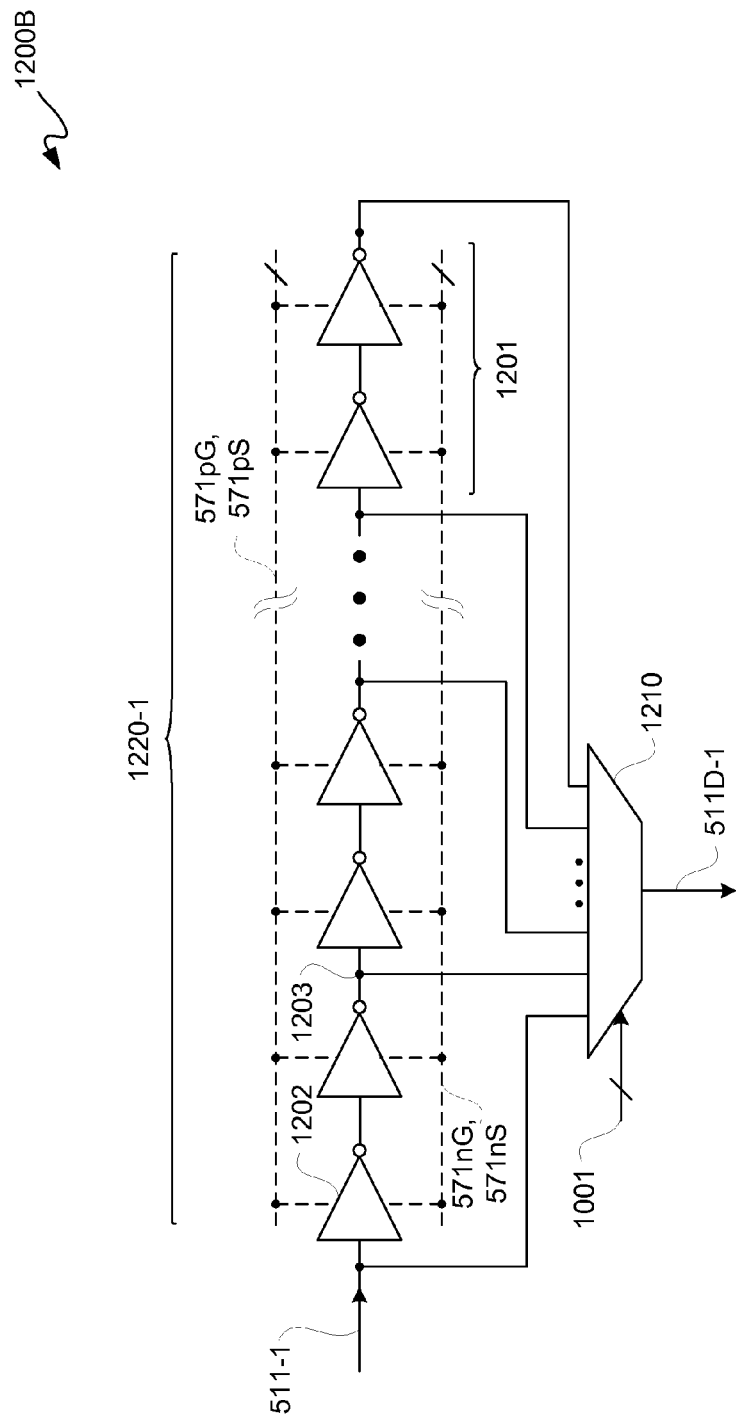

FIG. 12B is a circuit diagram depicting another exemplary embodiment of delay compensation circuit 1200B. Delay compensation circuits 1200A and 1200B respectively of FIGS. 12A and 12B are the same, except that delay compensation circuit 1200B includes regulated pull-up supply voltage 571pS-1 and/or pull-up gating voltage 571pG-1 to adjust drive strength of inverters 1202 of delay chain 1220-1. Along those lines, regulated pull-up supply voltage 571pS-1 and/or pull-up gating voltage 571pG-1 may be used to adjust pull-up delay of each of such inverters 1202 of delay chain 1220-1, whether such adjustment is to increase drive strength and thus reduce pull-up delay, or to decrease drive strength and thus increase pull-up delay. Furthermore, regulated pull-down supply voltage 571nS-1 and/or pull-down gating voltage 571nG-1 may be used to adjust drive strength of inverters 1202 of delay chain 1220-1. Along those lines, regulated pull-down supply voltage 571nS-1 and/or pull-down gating voltage 571nG-1 may be used to adjust delay of each of such inverters 1202 of delay chain 1220-1, whether such adjustment is to increase drive strength and thus reduce pull-down delay, or to decrease drive strength and thus increase pull-down delay.

Accordingly, pull-up and/or pull-down drive strength may be individually adjusted for a delay line 1220-N. Moreover, each of delay line 1220-N may be individually adjusted for pull-up and/or pull-down drive strength, such that not all delay lines 1220-N have to have the same pull-up and/or pull-down drive strength settings. In an embodiment, control select signal 1001 is provided to multiplexer 1210 using converter 1000A of FIG. 10A along with at least one other converter, as described below in additional detail. In another embodiment, in addition to converter 1000A, gating voltages 571pG-1 to 571pG-N ("gating voltages 571pG") and/or gating voltages 571nG-1 to 571nG-N ("gating voltages 571nG") are provided to inverters 1202 using converter 1000B of FIG. 10B, and supply voltages 571pS-1 to 571pS-N ("supply voltages 571pS") and/or supply voltages 571nS-1 to 571nS-N ("supply voltages 571nS") are provided to inverters 1202 using converter 1000C of FIG. 10C. In yet another embodiment, in addition to converter 1000A, gating voltage 571pG and 571nG and supply voltages 571pS and 571nS may be provided to inverters 1202 using converter 1100 of FIG. 11.

Figure 13:
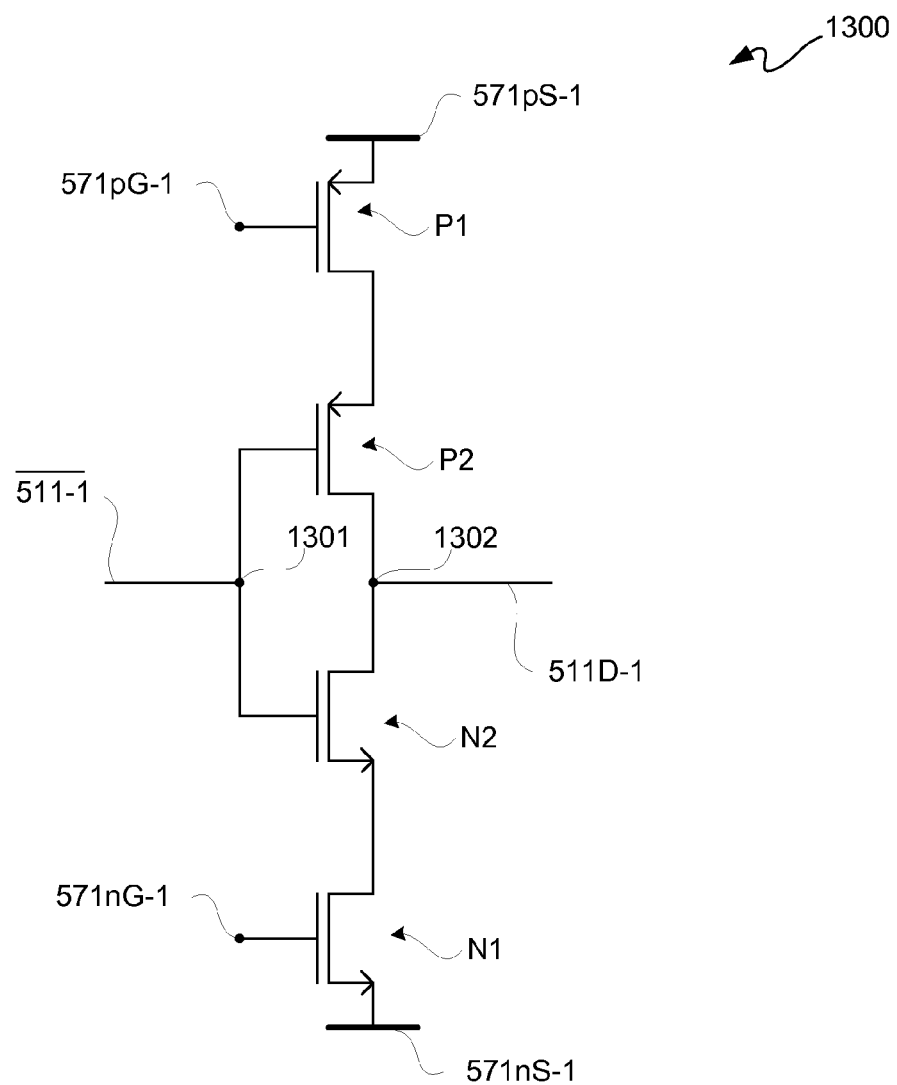
FIG. 13 is a circuit diagram depicting an exemplary embodiment of a delay compensated driver circuit.

FIG. 13 is a circuit diagram depicting an exemplary embodiment of a delay compensated driver circuit ("driver circuit") 1300. In this exemplary embodiment, driver circuit 1300 includes PMOS transistors P1 and P2 and further includes NMOS transistors N1 and N2. However, it should be understood that other configurations of driver circuit may be used in accordance with the following description. Furthermore, even though a complement of input signal 511-1 is illustratively depicted as an input to input node 1301 of driver circuit 1300, it should be understood that any input signal may be used.

Transistor P1 has a source node coupled to regulated supply voltage 571pS-1, and transistor N1 has a source node coupled to regulated supply voltage 571nS-1. A gate of transistor P1 is coupled to receive gating voltage 571pG-1, and a gate of transistor N1 is coupled to receive gating voltage 571nG-1. A drain node of transistor P1 is coupled to a source node of transistor P2, and a drain node of transistor N1 is coupled to a source node of transistor N2. Drain nodes of transistors P2 and N2 are coupled to output node 1302. Delay adjusted output signal 511D-1 is obtained from output node 1302 responsive to complement input signal 511-1 provided to input node 1301. Gates of transistors P2 and N2 are coupled to receive complement input signal 511-1.

Regulated supply voltage 571pS-1 and/or gating voltage 571pG-1 may be adjusted responsive to a difference signal 930 input to a converter, as previously described, to adjust drive strength of transistor P1. Likewise, regulated supply voltage 571nS-1 and/or gating voltage 571nG-1 may be adjusted responsive to a difference signal 930 input to a converter, as previously described, to adjust drive strength of transistor N1. Drive strength of transistor P1 affects delay of logic high transitions of pulses of delay adjusted output signal 511D-1, where the greater the drive strength generally the less delay and the less the drive strength generally the greater the delay. Drive strength of transistor N1 affects delay of logic low transitions of pulses of delay adjusted output signal 511D-1, where the greater the drive strength generally the less delay and the less the drive strength generally the greater the delay.

A difference signal 930 may be provided to a converter, such as converter 1100 of FIG. 11 for example, to cause such converter to output drive strength responsive to a difference value indicated by such difference signal 930. Such drive strength may be output as a pull-up gating voltage, a pull-up supply voltage, a pull-down gating voltage, a pull-down supply voltage, or any combination thereof.

Figure 15:
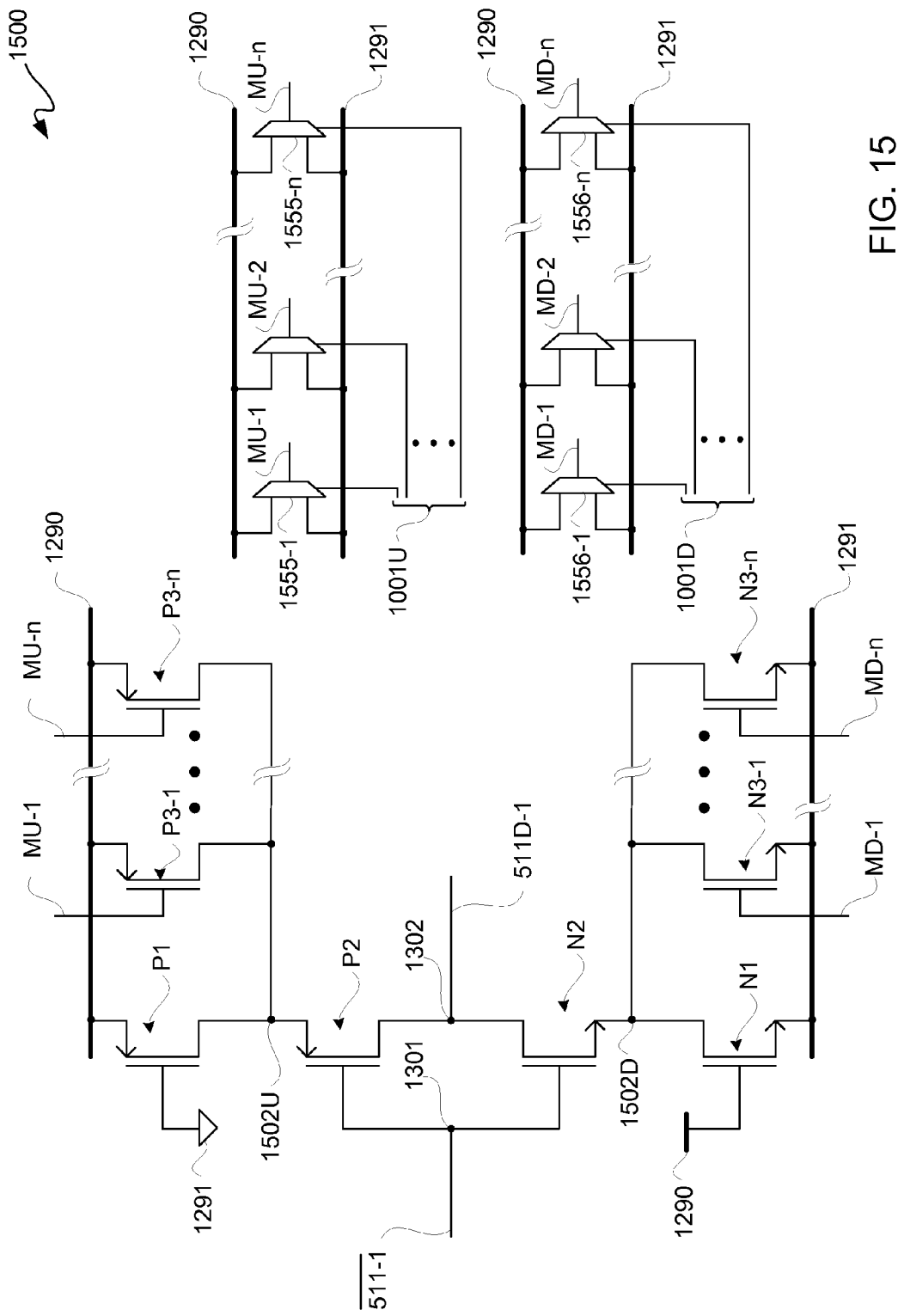
FIG. 15 is a circuit diagram depicting an exemplary embodiment of a delay compensated driver circuit.

FIG. 15 is a circuit diagram depicting an exemplary embodiment of a delay compensated driver circuit ("driver circuit") 1500. Driver circuit 1500 is similar to driver circuit 1300 of FIG. 13, so accordingly generally only differences are described for purposes of clarity.

In this exemplary embodiment, PMOS transistors P3-1 through P3-n (collective transistors "P3") are coupled in source/drain parallel with transistor P1, for n a positive integer greater than one. Source nodes of transistors P1 and P3 are coupled to Vdd 1290, and drain nodes of transistors P1 and P3 are coupled to pull-up node 1502U, which is coupled to a source node of transistor P2. NMOS transistors N3-1 through N3-n (collective transistors "N3") are coupled in source/drain parallel with transistor N1. Source nodes of transistors N1 and N3 are coupled to ground 1291, and drain nodes of transistors N1 and N3 are coupled to pull-down node 1502D, which is coupled to a source node of transistor N2.

A gate of transistor P1 is coupled to ground 1291, and gates of transistors P3-1 through P3-n are respectively coupled to pull-up multiplexer outputs MU-1 through MU-n. A gate of transistor N1 is coupled to Vdd 1290, and gates of transistors N3-1 through N3-n are respectively coupled to pull-down multiplexer outputs MD-1 through MD-n. Even though the same number of pull-up legs or transistors P3 and pull-down transistors N3 are illustratively depicted, in other embodiments these numbers may be different. Furthermore, the number of legs may vary from application-to-application depending on how much pull-up and pull-down drive strength granularity may be implemented for example.

Multiplexers 1555-1 through 1555-n (collectively multiplexers 1555) each have one input tied to Vdd 1290 and another input tied to ground 1291. Outputs of multiplexers 1555-1 through 1555-n respectively are signals MU-1 through MU-n.

Multiplexers 1556-1 through 1556-n (collectively multiplexers 1556) each have one input tied to Vdd 1290 and another input tied to ground 1291. Outputs of multiplexers 1556-1 through 1556-n respectively are signals MD-1 through MD-n.

Control select signal 1001U is an n-bit binary value, which may be a pull-up value of control select signal 1000 output from converter 1000A of FIG. 10A. Control select signal 1000U may thus respectively determine outputs of multiplexers 1555 for providing signals MU-1 through MU-n for adjusting pull-up drive strength. Generally, the more P3 transistors ON, the greater the pull-up drive strength, and the more P3 transistors OFF, the lesser the pull-up drive strength.

Control select signal 1001D is an n-bit binary value, which may be a pull-down value of control select signal 1000 output from converter 1000A of FIG. 10A. Control select signal 1000D may thus respectively determine outputs of multiplexers 1556 for providing signals MD-1 through MD-n for adjusting pull-down drive strength. Generally, the more N3 transistors ON, the greater the pull-down drive strength, and the more N3 transistors OFF, the lesser the pull-down drive strength.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
an interposer;
a first integrated circuit die, coupled to the interposer;
a second integrated circuit die coupled to the interposer;
wherein the first integrated circuit die includes an information generator, a signal delay compensator, and an input/output block;
wherein the information generator is configured to:
determine a first delay value for a first path of the interposer between the first integrated circuit die and the second integrated circuit die;
determine a second delay value for a second path of the interposer between the first integrated circuit die and the second integrated circuit die; and
determine a difference between the first delay value and the second delay value; and
wherein the signal delay compensator is coupled to receive the difference and configured to adjust a parameter of the first integrated circuit die to reduce the difference.

2. The apparatus according to claim 1, wherein:
the signal delay compensator includes a converter;
the converter is coupled to receive the difference and configured to select a drive strength responsive to the difference for adjustment of the parameter; and
the converter is coupled to a driver of the input/output block to provide the drive strength selected to the driver to drive a signal onto the first path of the interposer.

3. The apparatus according to claim 2, wherein the drive strength from the converter is provided as either or both a gating voltage and a supply voltage to transistors of the driver.

4. The apparatus according to claim 2, wherein the drive strength from the converter is provided as: a first binary sequence for selection of a number of pull-up transistors of the driver, and a second binary sequence for selection of a number of pull-down transistors of the driver.

5. The apparatus according to claim 4, wherein:
the first binary sequence is respectively provided as first control select signals to a first plurality of multiplexers of the driver;
the first plurality of multiplexers are coupled to logic high and low data inputs;
the second binary sequence is respectively provided as second control select signals to a second plurality of multiplexers of the driver; and
the second plurality of multiplexers are coupled to the logic high and low data inputs.

6. The apparatus according to claim 5, wherein the information generator includes a controller, a one-shot pulse generator coupled to the controller, and a counter coupled to the controller.

7. The apparatus according to claim 6, wherein:
the one-shot generator sends a pulse to the input/output block;
the pulse is for either the first path or the second path;
the counter receives a returned pulse responsive to the pulse;
the counter is configured to count a number of clock pulses between a send time of the pulse and a return time of the returned pulse; and
the controller is configured to determine the difference between the first delay value and the second delay value.

8. The apparatus according to claim 1, wherein:
the signal delay compensator includes a converter and a delay line circuit;

the converter is coupled to receive the difference and configured to provide a control select signal responsive to the difference; and
the delay line circuit is coupled to receive an input signal for output from the first integrated circuit die and coupled to receive the control select signal.

9. The apparatus according to claim 8, wherein:
the delay line circuit includes delay elements with taps between the delay elements and includes a multiplexer having data inputs coupled to the taps; and
the multiplexer is coupled to receive the control select signal to select a data input of the data inputs responsive to the difference for output of the input signal.

10. A method, comprising:
activating, at a first one of a plurality of first times, a counter of a first integrated circuit die;
wherein the counter is set to count to a threshold number;
sending, by the first integrated circuit die, a first one of a plurality of first pulses from the first integrated circuit die to a second integrated circuit die via an interposer;
returning, at a first one of a plurality of second times, a first one of a plurality of second pulses from the second integrated circuit die to the first integrated circuit die via the interposer;
sending a second one of the plurality of first pulses at a second one of the plurality of first times;
returning, at a second one of the plurality of second times, a second one of the plurality of second pulses from the second integrated circuit;
determining a difference;
wherein the difference is an elapsed time either between (a) the first one of the plurality of first times and a last one of the plurality of second times divided by the threshold number, or (b) a sum of each of the plurality of first times minus a corresponding one of the plurality of second times divided by the threshold number;
converting the difference for adjustment of a parameter of the first integrated circuit die; and
adjusting the parameter of the first integrated circuit die responsive to the difference.

11. The method according to claim 10, wherein:
the plurality of first pulses are sent from the first integrated circuit die to the second integrated circuit die via a path on the interposer; and
the plurality of second pulses are returned as from the second integrated circuit die to the first integrated circuit die via the path on the interposer.

12. The method according to claim 10, wherein:
the plurality of first pulses are sent from the first integrated circuit die to the second integrated circuit die via a first path on the interposer; and
the plurality of second pulses are returned from the second integrated circuit die to the first integrated circuit die via a second path on the interposer different from the first path.

13. The method according to claim 10, wherein the adjusting of the parameter includes:
selecting a drive strength responsive to the difference for adjustment of the parameter; and
providing the drive strength selected to a driver of the first integrated circuit die for driving a signal onto a path of the interposer.

14. The method according to claim 13, wherein the selecting includes:
   providing the difference to a converter; and
   outputting the drive strength from the converter responsive to the difference as either or both a gating voltage and a supply voltage.

15. The method according to claim 13, wherein the selecting includes:
   providing the difference to a converter; and
   outputting the drive strength from the converter responsive to the difference as a first binary sequence for selection of a number of pull-up transistors.

16. The method according to claim 15, wherein the selecting includes outputting the drive strength from the converter responsive to the difference as a second binary sequence for selection of a number of pull-down transistors.

17. The method according to claim 10, wherein the adjusting of the parameter includes:
   providing a signal as input to a delay line; and
   selecting a tap of the delay line responsive to the difference for output of the signal.

18. A method, comprising:
   coupling a particular one of a first plurality of integrated circuit dies and a particular one of a second plurality of integrated circuit dies to a particular one of a plurality of interposers, wherein each of the plurality of interposers has different configurations with different path delays;
   self-adjusting a parameter of the particular one of the first plurality of integrated circuit dies based on path delays of the particular one of the plurality of interposers that is selected;
   wherein the particular one of the first plurality of integrated circuit dies comprises an information generator and a signal delay compensator;
   wherein the information generator performs steps of:
      determining a first delay value for a first path of the particular one of the plurality of interposers between the particular one of the first plurality of integrated circuit dies and the particular one of the second plurality of integrated circuit dies;
      determining a second delay value for a second path of the particular one of the plurality of interposers between the particular one of the first plurality of integrated circuit dies and the particular one of the second plurality of integrated circuit dies; and
      determining a difference between the first delay value and the second delay value to obtain a path delay of the path delays; and
   wherein the signal delay compensator receives the difference and performs the step of the self-adjusting of the parameter of the particular one of the first plurality of integrated circuit dies to reduce the difference.

19. The method according to claim 18, wherein the plurality of interposers have the different configurations with the different path delays to accommodate different configurations of the first plurality of integrated circuit dies, the second plurality of integrated circuit dies, and the plurality of interposers.

20. The method according to claim 19, wherein:
   the first plurality of integrated circuit dies consists of same types of system-on-chip dies; and
   the second plurality of integrated circuit dies consists of same types of memory dies.

* * * * *